(12) United States Patent
Mikalo

(10) Patent No.: US 9,696,376 B2
(45) Date of Patent: Jul. 4, 2017

(54) LEAKAGE TESTING OF INTEGRATED CIRCUITS USING A LOGARITHMIC TRANSDUCER AND A VOLTMETER

(71) Applicant: GLOBALFOUNDRIES Inc., Grand Cayman (KY)

(72) Inventor: Ricardo Pablo Mikalo, Heideblick (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 134 days.

(21) Appl. No.: 14/645,541

(22) Filed: Mar. 12, 2015

(65) Prior Publication Data
US 2016/0266200 A1    Sep. 15, 2016

(51) Int. Cl.
*G01R 31/30* (2006.01)
*G01R 31/28* (2006.01)
*G01R 31/02* (2006.01)

(52) U.S. Cl.
CPC ....... *G01R 31/3008* (2013.01); *G01R 31/025* (2013.01); *G01R 31/2851* (2013.01)

(58) Field of Classification Search
CPC ......................... G01R 31/3008; G01R 31/2884
USPC ..................................................... 324/762.01
See application file for complete search history.

(56) References Cited

U.S. PATENT DOCUMENTS

| | | | |
|---|---|---|---|
| 2002/0084795 A1* | 7/2002 | Cook | G01R 31/2844 324/754.05 |
| 2006/0049820 A1* | 3/2006 | Miller | G01R 31/3008 324/754.07 |
| 2008/0290879 A1* | 11/2008 | Newton | G01R 31/028 324/548 |
| 2012/0229145 A1* | 9/2012 | Kerber | G01R 31/129 324/537 |

FOREIGN PATENT DOCUMENTS

JP        01250872 A   * 10/1989

* cited by examiner

*Primary Examiner* — Billy Lactaoen
(74) *Attorney, Agent, or Firm* — Amerson Law Firm, PLLC

(57) ABSTRACT

A test configuration for testing a leakage current of a device under test (DUT) of an integrated circuit is provided including a logarithmic transducer electrically connected to the DUT and a voltmeter electrically connected to the logarithmic transducer.

18 Claims, 3 Drawing Sheets

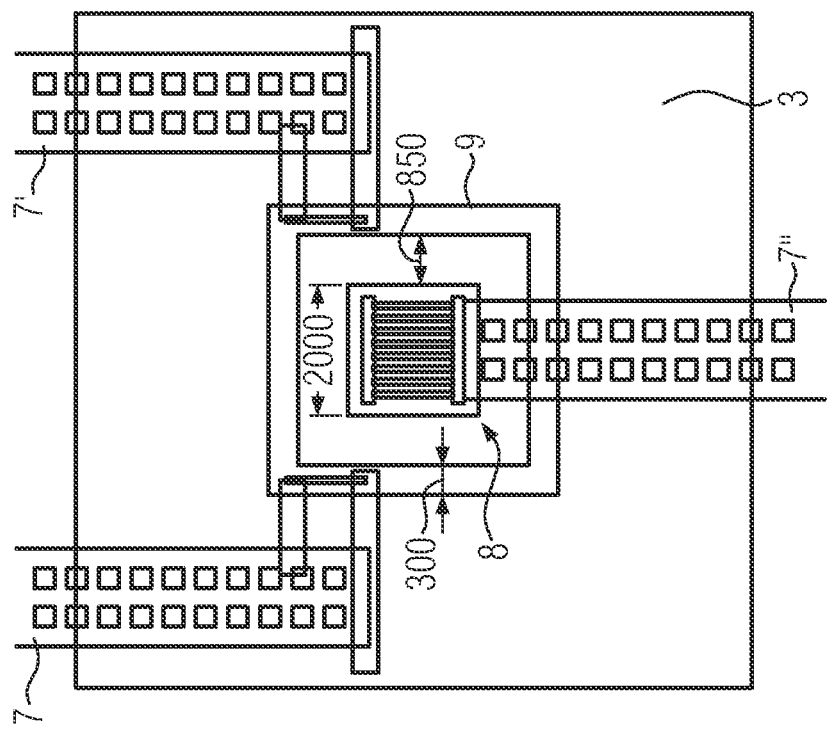
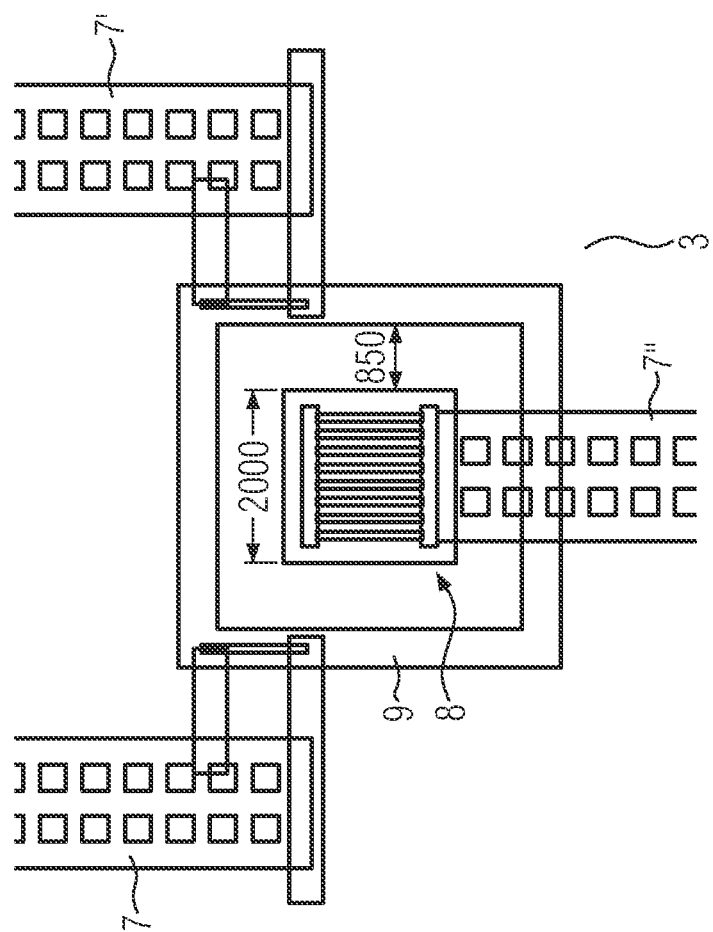
FIG. 4b
FIG. 4a

LEAKAGE TESTING OF INTEGRATED CIRCUITS USING A LOGARITHMIC TRANSDUCER AND A VOLTMETER

BACKGROUND OF THE INVENTION

1. Field of the Invention

Generally, the present disclosure relates to the field of the manufacture of integrated circuits and semiconductor devices, and, more particularly, to the measurement of leakage currents occurring in manufactured integrated circuits and devices.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer.

Integrated circuits comprising such complex devices of a great variety have to be tested for operation before they can be shipped. In fact, ICs are tested and characterized at different stages of the overall manufacturing process. The test and characterization data can be used to grade the performance of the ICs, and to eliminate ICs that fail to meet performance standards set by a manufacturer. For example, one class of tests is performed when the ICs are fully formed, but have not yet been diced into individual chips. The test results are analyzed, and the ICs that fail to meet the required performance standards are discarded when the wafer is diced.

After the ICs are cut from the wafer and separated from each other, and after the ICs that failed the wafer sort test have been eliminated, the remaining ICs are assembled into their packages. The assembly process may involve attaching bond wires or solder bumps to the I/O bonding pads of the IC, connecting the IC to a substrate, and enclosing the IC in a protective package. Once assembly is complete, another set of final tests may be performed. At final test, automated test equipment (ATE) tests the performance of the fully assembled ICs, and, as with the wafer sort test, ICs that fail to meet the performance standards set by a manufacturer are discarded. One common parameter that is tested prior to shipping an IC to a customer is the input leakage current. Input leakage current refers to the static current drawn at an input. Normally, this measurement is made using a precision measurement unit (PMU). If any I/O on an IC shows input leakage current in excess of the maximum set by the manufacturer, the IC is discarded.

In particular, in the context of recent low power technologies, it has become of increasing importance to test for/monitor leakage currents such as device leakages and wiring leakages. Due to the vast plurality of leakage paths in present ICs, leakage parameters may contribute with about 30-40% to the overall monitored electrical para me ers.

Currently the measurement of leakage current parameters is usually performed by applying a constant voltage and measuring the current in autorange mode. Autorange mode is required, since the expected value may be in a very wide range, from some pA up to μA. Therefore, recent instruments must change their measuring range during measurement, which is very time consuming. Usual measurement times are in the range of some 200 ms. In typical parameter measurement programs, the leakage current parameters measurement time sums up to about 20 min per wafer, which is significant and requires reduction. During data evaluation, the leakage current parameters are evaluated on a logarithmic scale. It should be noted that the exact value, i.e., the mantissa of the value, is less important than the order of magnitude. Thus, leakage current parameters are required to be measured very exactly.

In view of the situation described above, the present disclosure provides techniques for determining leakage currents over a wide range of magnitudes of the current strengths with reduced measurement times as compared to the art.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

A test configuration for testing a leakage current of a device under test (DUT) of an integrated circuit is provided including a logarithmic transducer and a voltmeter. The logarithmic transducer is electrically connected to the DUT and the voltmeter is electrically connected to the logarithmic transducer.

Moreover, an exemplary test configuration for testing a leakage current of a device under test (DUT) of an integrated circuit includes a power node supplying a measurement voltage to the DUT via a first probe pad of the integrated circuit, a logarithmic transducer electrically connected to the DUT, a voltmeter electrically connected to the logarithmic transducer via a second probe pad of the integrated circuit, and an operational amplifier electrically connected to the DUT and the logarithmic transducer via a third probe pad and electrically connected to the voltmeter.

An illustrative method of determining a leakage current of a device under test (DUT) of an integrated circuit includes the steps of electrically connecting the DUT to a logarithmic transducer, electrically connecting the logarithmic transducer to a voltmeter and measuring a voltage corresponding to a leakage current of the DUT by the voltmeter.

A plurality of DUTs may be connected to the same logarithmic transducer. By the voltmeter, a voltage corresponding to a leakage current of the DUT can be measured. The voltage lies within one single decade due to the operation of the logarithmic transducer that translates values of leakage currents in a wide range of orders of magnitudes that might be exhibited by a variety of DUTs to voltages with values lying within one single decade. In particular, the logarithmic transducer may be realized by a diode transducer/diode.

BRIEF DESCRIPTION OF THE DRAWINGS

The disclosure may be understood by reference to the following description taken in conjunction with the accompanying drawings, in which like reference numerals identify like elements, and in which:

FIGS. 4a and 4b illustrate layouts of P-type and N-type diode transducers that may be used in a test configuration according to the present invention.

Figure 1:
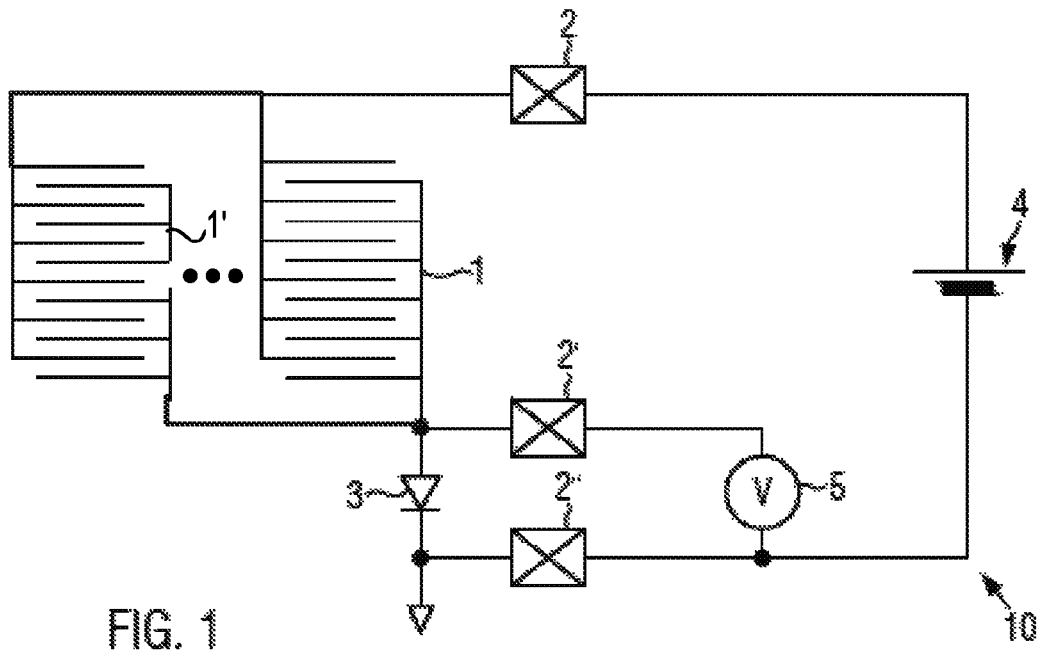
FIG. 1 illustrates a test configuration comprising a diode transducer according to an example of the present invention.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the present methods are applicable to a variety of technologies, e.g., NMOS, PMOS, CMOS, etc., and is readily applicable to a variety of devices, including, but not limited to, logic devices, memory devices, etc., comprised in integrated circuits.

The present disclosure provides a method of measuring leakage currents wherein the measurement times can be reduced from conventionally needed 200 ms down to about 60 ms. The measurement time per wafer can, thereby, be reduced by about 14 min. The invention deals with an integrated diode transducer, which executes the logarithmic scaling already before the measurement instrument. This allows the measurement instrument to measure a simple voltage in a fixed range, which saves a significant amount of time (factor ~3 reduction of time needed).

An illustrative example of a test configuration 10 provided herein is shown in FIG. 1. The test configuration 10 comprises a test structure and a measurement circuit. The test structure may comprise an integrated circuit (IC) formed on a wafer. The wafer may comprise a semiconductor substrate. The semiconductor substrate may comprise a semiconductor layer, which in turn may be comprised of any appropriate semiconductor material, such as silicon, silicon/germanium, silicon/carbon, other II-VI or III-V semiconductor compounds and the like. The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. Furthermore, the substrate and the semiconductor layer may define an SOI configuration. The semiconductor substrate may be a silicon substrate, in particular, a single crystal silicon substrate. Other materials may be used to form the semiconductor substrate such as, for example, germanium, silicon germanium, gallium phosphate, gallium arsenide, etc.

In particular, the test configuration comprises a device under test (DUT) 1 being part of the IC. The DUT 1 may be any device and/or wiring formed as part of the IC. In the shown example, the DUT 1 may be a metal comb. The IC comprises probe pads 2, 2' and 2" that may be formed as Input/Output probe pads as known in the art. According to the illustrative example shown in FIG. 1, the test structure also comprises a logarithmic transducer 3. The logarithmic transducer 3 allows for logarithmically transducing leakage currents of the DUT 1 into voltages. For example, the logarithmic transducer 3 comprises or is realized by a diode.

In principle, a logarithmic transducer may be provided as an external element, which requires measurement equipment to become specialized for the leakage measurements under consideration. However, it might be preferred to produce the logarithmic transducer 3 during the semiconductor manufacturing process and having it present in the wafer under test.

As shown in FIG. 1, a measurement circuit is connected to the test structure via probe pads 2, 2' and 2". The measurement circuit comprises a power node 4 supplying a well-defined measurement voltage and a voltmeter 5 connected between probe pads 2' and 2". Based on the measurement voltage supplied by the power node 4, a leakage current of DUT 1 can be measured by the voltmeter 5 after conversion of the leakage current into a voltage by means of the logarithmic transducer 3. A plurality of DUTs 1' may be connected to the logarithmic transducer 3. Leakage currents of DUTs may, in principle, arise over many decades. For example, one particular DUT connected to the logarithmic transducer 3 may exhibit a leakage current on some nA, whereas another DUT connected to the logarithmic transducer 4 exhibits a leakage current of some pA. Whereas three orders of magnitudes lie between these values, the logarithmic operation of the logarithmic transducer 3 results in voltages corresponding to the values of the leakage currents within the same decade.

Thus, the logarithmic voltage output provided by the logarithmic transducer 3 allows for operation of the voltmeter 5 in a fixed range. No adaptation of a measuring device to the order of magnitude of a leakage voltage of a particular DUT under consideration is needed, therefore. Consequently, fast measurement of the leakage current is achieved. It should be noted that a plurality of DUTs of an IC can be connected to the same logarithmic transducer 3. The configuration shown in FIG. 1, particularly, is suitable for leakage measurements of Back-End-of-Line (BEOL) comb-comb configurations or BEOL comb-meander configurations or design rule leakage measurement, for example.

Figure 2:
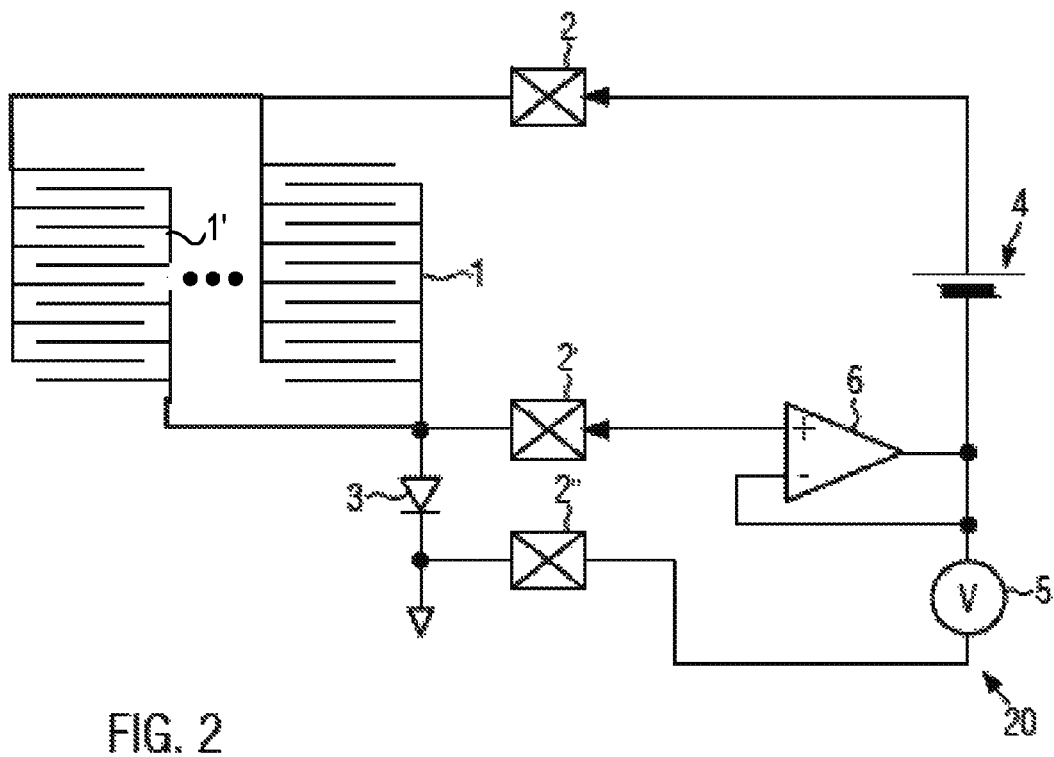
FIG. 2 illustrates a test configuration comprising a diode transducer and an operation amplifier according to an example of the present invention.

However, due to the relatively high-Ohmic connection between pad 2' and the voltmeter 5, the load voltage across the logarithmic transducer 3 is relatively high. Therefore, active electric potential control might be preferred. FIG. 2 shows a test configuration 20 according to a further example of the present invention. As in the example shown in FIG. 1 a test structure comprising a DUT 1, for example, a metal comb, probe pads 2, 2' and 2" and a logarithmic transducer 3 is provided. Moreover, a measurement circuit is connected with the test structure, wherein the measurement circuit comprises a power node 4 and a voltmeter 5.

Different from the configuration illustrated in FIG. 1, in the test configuration shown in FIG. 2 an operation amplifier 6 is included. The operation amplifier 6 may be connected between the pad 2' and the voltmeter 5. Again, a plurality of DUTs 1' may be connected with the logarithmic transducer 3. As described with reference to FIG. 1, the logarithmic transducer 3 allows for operation of the voltmeter 5 in a fixed range and, thereby, for fast determination of leakage currents of DUTs, for example, DUT 1.

In the configuration shown in FIG. 2, the operational amplifier 6 can be operated to compensate for the load voltage across the logarithmic transducer 3. Thus, the accuracy of the voltage measurement may be increased significantly. A test configuration comprising the operational amplifier 6 configured for active compensation of the load voltage across the logarithmic transducer 3 is particularly suitable for determining leakage currents of active devices as transistors (for example, N-channel and P-channel TFTS) and the determination of the leakage properties of wells and diffusion and isolation leakage measurements.

Figure 3:
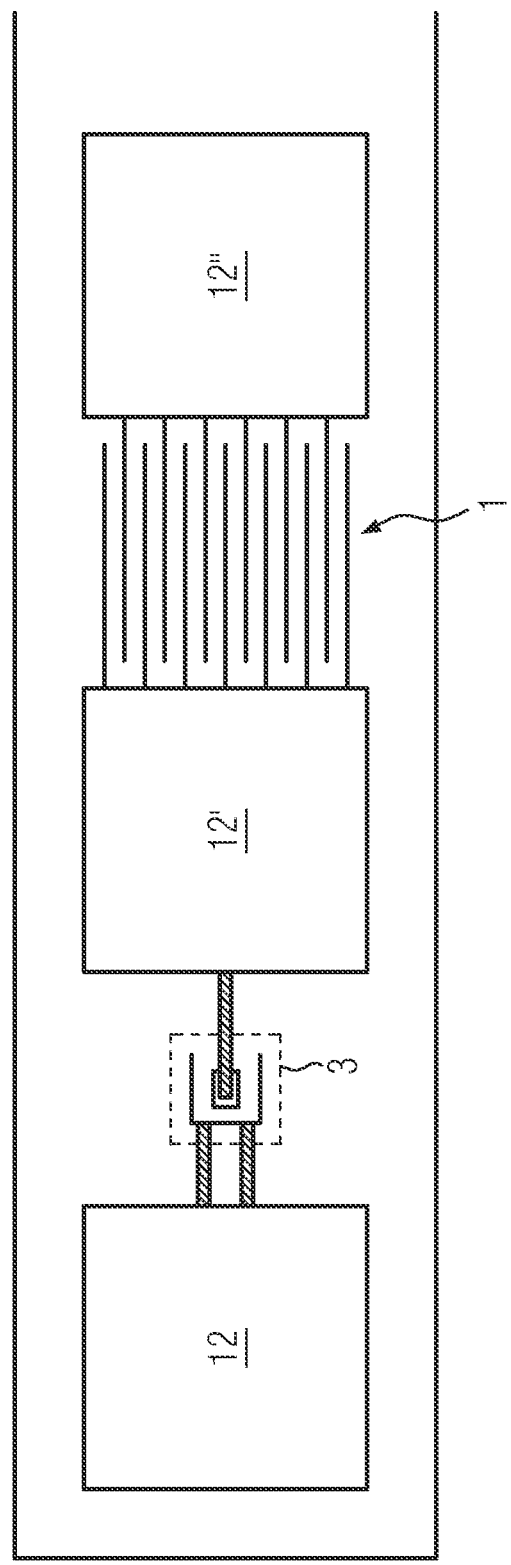
FIG. 3 shows an example for implementing a diode transducer in a test configuration according to the present invention.

FIG. 3 shows an exemplary implementation of the logarithmic transducer 3 shown in FIGS. 1 and 2. In the example shown in FIG. 3, the logarithmic transducer 3 in the form of a diode transducer is connected between a first probe pad 12 and a second probe pad 12'. The second probe pad 12' is shared with a DUT 1, in the form of a comb-comb structure in the shown example. By this kind of electrical connection of the logarithmic transducer (diode transducer) 3 and the DUT 1 to the probe pads 12 and 12', both conventional leakage measurement and leakage measurement making use of the logarithmic transducer (diode transducer) 3 can be realized, in principle. Moreover, the shown configuration allows for a pre-characterization of the diode by which implant fluctuations can readily be determined. Opposite to the side of connection to the second probe pad 12', the DUT 1 is connected to a third probe pad 12" (confer probe pad 2 in FIGS. 1 and 2).

FIGS. 4a and 4b show in some detail diode transducers 3 suitable for transducing/converting leakage currents of different orders of magnitude to voltages of a single decade that can be measured by a voltmeter without the need of switching measuring ranges, thereby reducing the overall measurement time of leakage testing of a wafer. FIG. 4a shows an N-type diode 3 whereas FIG. 4b shows a P-type diode 3, both with wirings 7, 7' and 7".

The N-type diode 3 of FIG. 4a may comprise an $N^+$-doped cathode 8 and $P^+$-doped anodes 9 that may be separated from the cathode by shallow trench isolators, for example. The P-type diode 3 of FIG. 4b may comprise a $P^+$-doped anode 9 and $N^+$-doped cathodes 8 that may be separated from the anode by shallow trench isolators, for example. The anodes 9 of the N-type diode 3 of FIG. 4a are connected to metal wirings 7 and 7' whereas the cathodes 8 of the P-type diode of FIG. 4b are connected to metal wirings 7 and 7'. The cathode 8 of the N-type diode 3 of FIG. 4a is connected to metal wiring 7" whereas the anode 9 of the P-type diode of FIG. 4b is connected to metal wiring 7". Typical dimensions (as shown on FIGS. 4a and 4b) are given units of nm.

It should be noted that usually the temperature of the entire wafer under test is controlled during leakage testing and, therefore, the temperature of the diode transducer 3 itself is controlled which results in an enhanced accuracy of the leakage measurements. In order to suppress parasitic impedances, the wirings 7, 7' and 7" should be provided by highly electrical conductive materials.

As a result, the present disclosure provides techniques for leakage measurements of wafers/ICs wherein a logarithmic transducer, for example, a diode, is employed in order to perform logarithmic operations on values of leakage currents. The logarithmic operations result in voltages corresponding to the leakage currents with a value range within one decade. Consequently, a voltmeter operating in one particular voltage decade only can be used for measuring voltages corresponding to leakage currents of DUTs. Since, contrary to the art, no switching of measurement ranges from one decade to another is needed, overall leakage measurement of a wafer/IC is significantly speeded up.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A test configuration for testing a leakage current of a device under test (DUT) of an integrated circuit, comprising:
   a logarithmic transducer having a first input connected to said DUT and a first output;
   an operational amplifier having a second input connected to the first input of the logarithmic transducer, a second output, and a third input connected to the second output; and
   a voltmeter electrically connected to said second output of said operational amplifier and said first output of said logarithmic transducer.

2. The test configuration of claim 1, wherein said logarithmic transducer is formed on a wafer comprising said integrated circuit.

3. The test configuration of claim 1, wherein said logarithmic transducer comprises a diode.

4. The test configuration of claim 3, wherein said diode is a P-type or N-type diode.

5. The test configuration of claim 1, further comprising a power node supplying a measurement voltage to said DUT and wherein said power node is electrically connected to said DUT via a first probe pad and said logarithmic transducer is connected to said voltmeter via a second probe pad.

6. The test configuration of claim 1, wherein said second output of said operational amplifier is connected to a power node supplying a measurement voltage to said DUT and to said voltmeter.

7. The test configuration of claim 1, wherein a plurality of DUTs are electrically connected to said logarithmic transducer.

8. A test configuration for testing a leakage current of a device under test (DUT) of an integrated circuit, comprising
a power node supplying a measurement voltage to said DUT via a first probe pad of said integrated circuit;
a logarithmic transducer having a first input electrically connected to said DUT and a first output;
an operational amplifier having a second input connected to said first input of said logarithmic transducer via a second probe pad, a second input coupled to said power node, and a second output connected to said power node; and
a voltmeter coupled to said power node and connected via a third probe pad to said first output of said logarithmic transducer.

9. The test configuration of claim 8, wherein said logarithmic transducer is formed on a wafer comprising said integrated circuit.

10. The test configuration of claim 8, wherein said logarithmic transducer comprises a diode.

11. The test configuration of claim 10, wherein said diode is a P-type or N-type diode.

12. The test configuration of claim 8, wherein said DUT is selected of a group consisting of a metal comb, a comb-comb structure, a comb-meander structure, a well and a transistor.

13. A method of determining a leakage current of a device under test (DUT) of an integrated circuit, comprising the steps of:
electrically connecting said DUT to a first input of a logarithmic transducer;
electrically connecting a first output of said logarithmic transducer to a voltmeter;
electrically connecting a first input of an operation amplifier to said first input of said logarithmic transducer,
electrically connecting a second input and a second output of a said operational amplifier to said voltmeter; and
measuring a voltage corresponding to a leakage current of said DUT by said voltmeter.

14. The method of claim 13, further comprising forming said logarithmic transducer on a same wafer whereupon said integrated circuit is formed.

15. The method of claim 13, further comprising transducing by said logarithmic transducer a leakage current of said DUT to the voltage measured by said voltmeter.

16. The method of claim 13, wherein said logarithmic transducer comprises a diode.

17. The method of claim 13, further comprising controlling a load voltage across said logarithmic transducer using said operational amplifier.

18. The method of claim 13, wherein said voltmeter is operated in a fixed measuring range of a particular decade only.

* * * * *